(12) United States Patent
Dickson et al.

(10) Patent No.: US 6,428,349 B1
(45) Date of Patent: Aug. 6, 2002

(54) METHOD AND APPARATUS FOR JUMPERING RESISTORS AND OTHER COMPONENTS ON A PRINTED CIRCUIT BOARD

(75) Inventors: Andrew H. Dickson, Fair Oaks; Wayne A. Foster, Rocklin, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/846,137

(22) Filed: Apr. 30, 2001

(51) Int. Cl.$^7$ ................................................ H01R 31/08
(52) U.S. Cl. ........................................ 439/513; 439/507
(58) Field of Search ........................ 439/507, 509, 439/188, 181, 513, 511, 512

(56) References Cited

U.S. PATENT DOCUMENTS

| | | | | |
|---|---|---|---|---|
| 3,653,498 A | * | 4/1972 | Kisor | 439/511 |
| 4,019,094 A | * | 4/1977 | Dinger et al. | 439/511 |
| 4,596,429 A | * | 6/1986 | Gierut et al. | 439/507 |
| 5,108,299 A | * | 4/1992 | Cronin | 439/188 |
| 5,562,489 A | * | 10/1996 | Cronin | 439/513 |

* cited by examiner

*Primary Examiner*—P. Austin Bradley
*Assistant Examiner*—Briggitte R. Hammond
(74) *Attorney, Agent, or Firm*—David A. Plettner

(57) ABSTRACT

A conductive clip is placed over a component mounted to a printed circuit board (PCB) to form a conductive path between terminals of the component. In one embodiment, a conductive clip is placed over a surface mount technology (SMT) component, with the clip having ends that include a flared portion and a sharp triangular retainment detent. In another embodiment, the clip has a shoe box shape and includes two sides having retainment detents that are disposed to engage an area between an edge of the component and the PCB. In yet another embodiment, the present invention is adapted for use with through hole mounted components having axial leads, with each end of the clip including a slot that engages a lead when the clip is pressed onto the component. The present invention allows a PCB to be designed to support multiple configurations without using DIP switches or headers/jumpers.

12 Claims, 4 Drawing Sheets

METHOD AND APPARATUS FOR JUMPERING RESISTORS AND OTHER COMPONENTS ON A PRINTED CIRCUIT BOARD

FIELD OF THE INVENTION

The present invention relates to method and apparatus for jumpering resistors and other components on a printed circuit board. More specifically, the present invention relates to a small clip or shoe box shaped jumper adapted to fit snugly over a component to create a short between terminals of the component.

DESCRIPTION OF THE RELATED ART

In the electronic arts, it is common to attach components to a printed circuit board (PCB). Typically the PCB contains a plurality of layers that carry PCB traces between contact points on the board. One common prior art technique used to attach components to a PCB is to provide a series of holes in the board, with the traces providing conduction paths between holes. When the PCB is assembled, components having leads or pins are inserted into the holes and soldered to the PCB. One of the disadvantages of this technique is that traces cannot be routed in any of the layers at the location of the hole.

More recently, it has become common to mount components to the surface of the PCB. This technique is known in the art as "surface mount technology" (SMT). FIG. 1 shows a prior art configuration 10 wherein an SMT component 12, such as a resistor, is mounted to a PCB 14. Component 12 includes conductive ends 15, which are the terminals of the component. When component 12 is assembled to PCB, the component is placed on the PCB and soldered in place using a technique such as a wave solder operation. The result is a pair of solder fillets 16 formed by surface tension interactions between the terminals, solder and PCB. One of the advantages of this technique is that PCB traces can be routed under solder fillets, thereby increasing PCB routing efficiency.

In the art, it is known to have a single PCB design support a variety of configurations. For example, a computer system motherboard may support several CPUs that each operate at unique voltages and clock frequencies. Of course, one technique is to design and manufacture several variations of the board. This approach is expensive because it requires additional design time, and extra configurations and inventories must be managed.

Another approach is to provide some type of configuration mechanism on the board. One common method is to mount a series of dual in-lin package (DIP) switches to the board. DIP switches are relatively expensive, and are often mounted to the board using through hole mounting techniques, as discussed above. Furthermore, DIP switches require a relatively large amount of space on the board, and require at least a pair PCB traces for each switch. The switches are used to perform such functions as selectively coupling a configuration pin of an integrated circuit (IC) to a high or low voltage, switch resistors into or out of a voltage divider that is used to generate a reference voltage, alter a multiplier or divider that is used to generate a clock signal, and the like. Often the DIP switches are set once, and are never touched again for the life of the product.

A similar technique is to mount a series of pin headers to the PCB. Pin headers are typically mounted using through hole techniques. Jumpers are then placed over the pin headers to selectively make or break a connection between the pins. The jumpers are comprised of a small plastic box having an open end, with a piece of conductive metal having two curled ends positioned in the box. When the jumper is placed over a pair of pins, the curled metal ends surround the pins.

Both DIP switches and headers/jumpers require board traces and typically through holes. Furthermore, the PCB must be designed to accommodate these devices before the PCB is manufactured. What is needed in the art is an inexpensive and simple method to configure a PCB without requiring through holes, additional PCB traces, and additional space on the PCB, and that also has the potential to provide PCB configuration options that were not anticipated when the PCB was designed.

SUMMARY OF THE INVENTION

The present invention is a conductive clip that can be placed over a component mounted to a printed circuit board (PCB), thereby providing a conductive path between terminals of the component to bypass the component. By designing a PCB to use the present invention, dual in-lin package (DIP) switches and headers/jumpers can be eliminated.

The present invention does not require any additional space on a PCB, and does not require any additional PCB traces, thereby reducing PCB cost. In addition to reducing the cost of a PCB, the conductive clips themselves are much less expensive than either DIP switches or headers/jumpers, thereby reducing costs even further.

In one embodiment, a conductive clip in accordance with the present invention is placed over a surface mount technology (SMT) component. In this embodiment, the clip includes a cylindrical member that provides additional resilient force to urge the ends of the clip into contact with the ends of the component. The cylindrical member also provides a convenient "handle" to allow an assembler to position the clip onto the component, and to remove the clip by inserting a small tool into the cylindrical member and prying the clip away from the component. Each clip end also includes a flared portion and a sharp triangular retainment detent. The flared portion maximizes contact with a solder fillet and allows the flared portion to slide down over the fillet and snugly into place. The retainment detent is disposed to allow the clip to be easily positioned onto the component, while also retaining the clip in place, and also provides an additional reliable point of electrical contact between the clip and the terminal of the component.

In another embodiment, the clip has a shoe box shape and includes two sides having retainment detents. These retainment detents are disposed to slide under SMT components that have a center section not in contact with the PCB, or engage an area between a beveled edge of the component and the PCB.

Another embodiment of the present invention is adapted for use with through hole mounted components having axial leads. In this embodiment, the end of each clip includes a slot that engages the leads when the clip is pressed onto the component.

The present invention allows a PCB to be designed to support multiple configurations without using DIP switches or headers/jumpers. The present invention does not require any additional space on a PCB, and does not require any additional PCB traces, thereby reducing PCB cost. In addition to reducing PCB costs, the conductive clips themselves are much less expensive than either DIP switches or headers/jumpers, thereby reducing costs even further. Finally the present invention can be used to alter circuits in ways that were not anticipated when the PCB was designed.

DETAILED DESCRIPTION OF THE PREFERRED EMBODIMENTS

The present invention is a conductive clip that can be placed over a component mounted to a printed circuit board (PCB), thereby providing a conductive path between terminals of the component to bypass the component. By designing a PCB to use the present invention, dual in-lin package (DIP) switches and headers/jumpers can be eliminated. For example, a configuration pin of an integrated circuit (IC) can be coupled to a voltage divider having a first terminal of a first resistor having a relatively low resistance coupled to a high voltage, and a first terminal of a second resistor having a relatively high resistance coupled to a low voltage, with the second terminals of the two resistors coupled to each other and the configuration pin of the IC. When the conductive clip of the present invention is not present, the configuration pin will be pulled high. When the conductive clip is placed over the second resistor, the configuration pin is pulled low. Of course, if the configuration pin has an internal pull-up resistor, only the second resistor is required.

Similarly, if a voltage divider is used to form a reference voltage, the divider can have an upper leg formed from two resistors coupled in series and a lower leg formed from two resistors coupled in series, with the desired voltage found at the node between the two legs. By selectively removing or placing the clip of the present invention over the resistors of the voltage divider, a variety of reference voltages can be achieved.

Also note that the conductive clip of the present invention can be used with other components coupled to a PCB, such as diodes, capacitors, inductors, transistors, and ICs. For example, it is possible to alter the frequency response of an op-amp based low-pass filter by placing a conductive clip in accordance with the present invention over a capacitor. Furthermore, the present invention can be used to alter circuits in ways that were not anticipated when the PCB was designed.

Note that the present invention does not require any additional space on a PCB, and does not require any additional PCB traces, thereby reducing PCB cost. In addition to reducing PCB costs, the conductive clips themselves are much less expensive than either DIP switches or headers/jumpers, thereby reducing costs even further.

Figure 1:
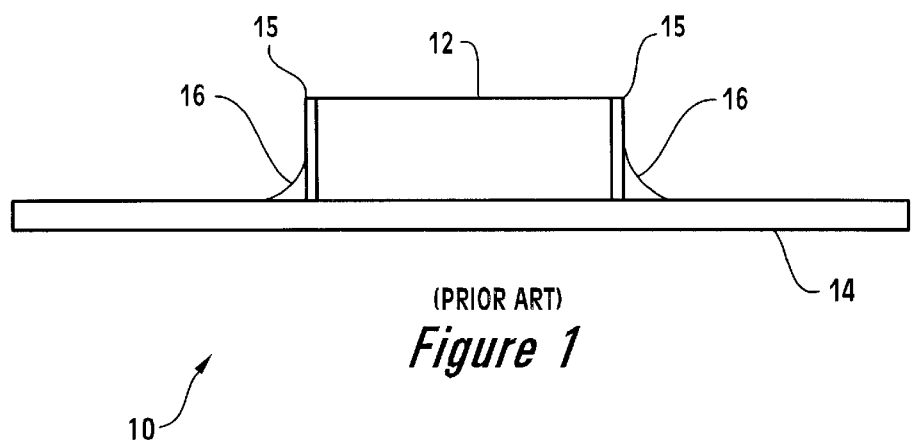
FIG. 1 shows a prior art configuration wherein a surface mount technology (SMT) component, such as a resistor, is mounted to a printed circuit board (PCB).
Figure 2:
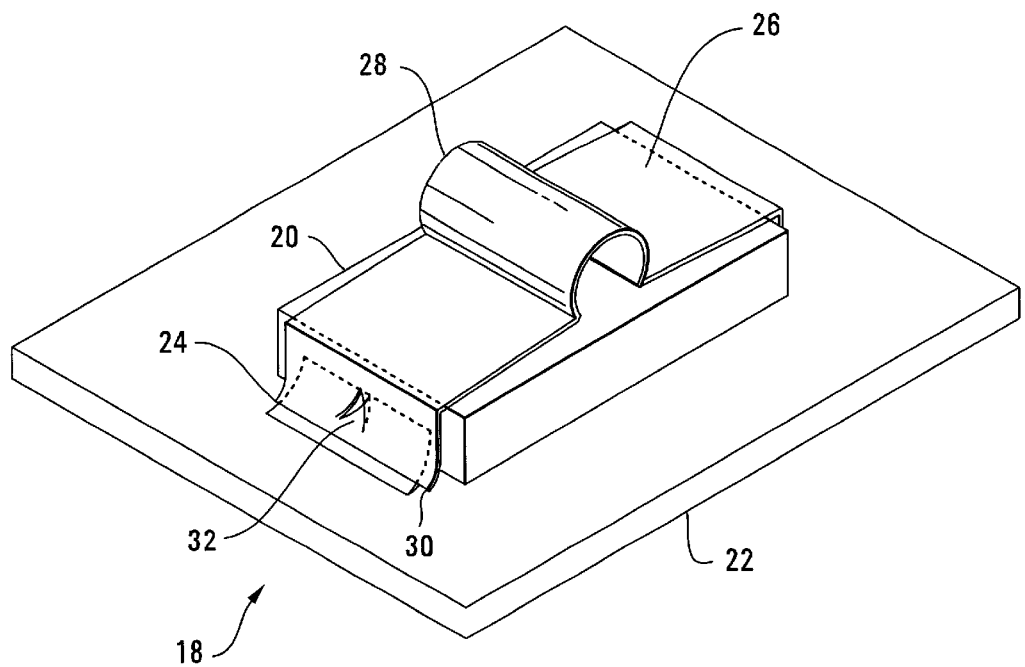
FIG. 2 is a perspective view showing a configuration in which a clip in accordance with an embodiment of the present invention is deployed.

FIG. 2 is a perspective view showing a configuration 18 in which an embodiment of the present invention is deployed. Configuration 18 includes a PCB 22 and a surface mount technology (SMT) component 20 (such as an SMT resistor) arranged in a manner similar to that of configuration 10 shown in FIG. 1. A pair of solder fillets (such as fillet 24) couple component 20 to PCB 22.

In accordance with one embodiment of the present invention, conductive clip 26 is placed over component 20. Clip 26 includes a cylindrical member 28. Member 28 provides additional resilient force to urge the ends of clip 26 into contact with the ends of component 20, and also provides a convenient "handle" to allow an assembler to position clip 26 onto component 20, and to remove clip 26 by inserting a small tool into member 28 and prying clip 26 away from component 20.

Figure 3:
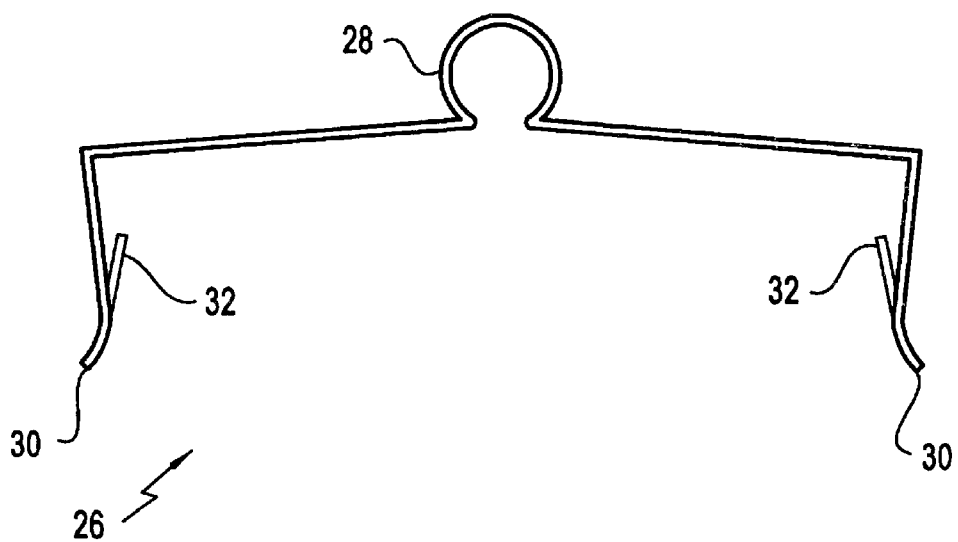
FIG. 3 is a side view of the clip of FIG. 2, and more clearly shows a cylindrical member, flared portions, and retainment detents shown in FIG. 2.
Figure 4:
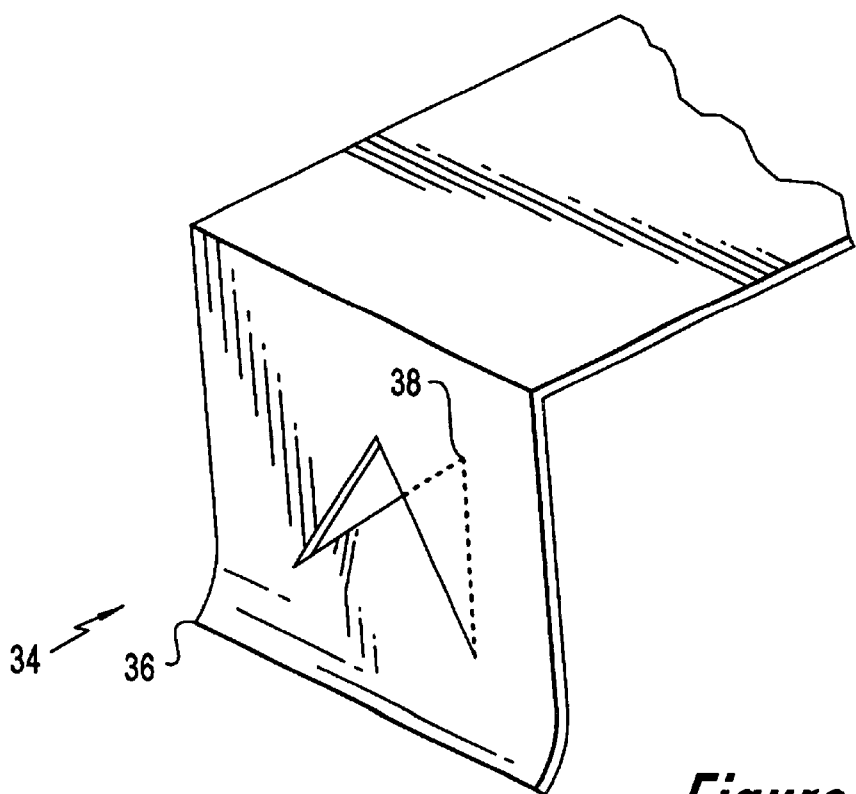
FIG. 4 is a perspective view of a portion of a different embodiment of the present invention.

As will be seen in more detail in FIGS. 3 and 4, each end of clip 26 also includes a flared portion 30 and a retainment detent 32. Flared portion 30 is flared at approximately 45° to maximize the contact area between clip 26 and solder fillet 24, and to allow the flared portion to slide down over the fillet and snugly into place. Retainment detent 32 is a relatively sharp triangle punched out from the end of clip 26. The angle of the sharp triangle is disposed to allow clip 30 to be easily pressed onto component 20, while also retaining clip 26 to component 20 and making it relatively more difficult to remove clip 26. Furthermore, retainment detent 32 provides an additional reliable point of electrical contact between conductive clip 26 and the end of component 20. Clip 26 may be formed from a variety of suitable conductive materials known in the art, such as beryllium-copper.

FIG. 3 is a side view of clip 26 of FIG. 2, and more clearly shows cylindrical member 28, flared portions 20, and retainment detents 32. FIG. 4 is a perspective view of a portion of a different embodiment of the present invention. In FIG. 4, clip 34 is narrower than clip 26 of FIGS. 2 and 3. Accordingly, clip 34 is well suited for use with components having three or more terminals, such as an IC, where it is desirable to only couple conductively two of the terminals together. Similar to clip 26, clip 34 also includes a flared portion 36 and a retainment detent 38.

Figure 5:
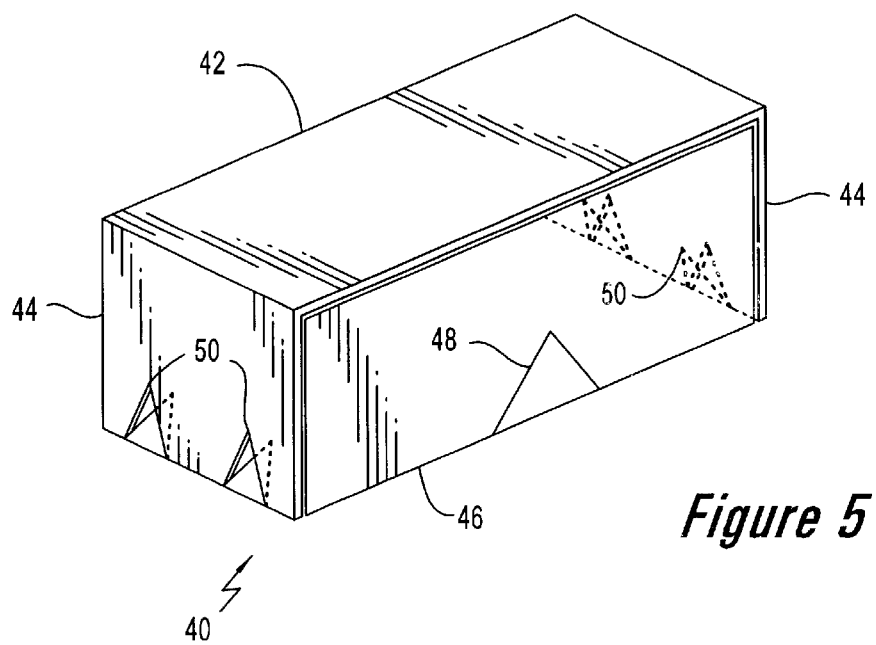
FIG. 5 shows a clip in accordance with another embodiment of the present invention wherein a clip has a shoe box shape.

FIG. 5 shows another embodiment of the present invention wherein a clip 40 has a shoe box shape. Clip 40 includes a top 42, two ends 44, and two sides (side 46 is visible in FIG. 5). The sides include retainment detents, such as retainment detent 48 on side 46. The retainment detent is disposed to slide under SMT components that have a center section not in contact with the PCB. Alternatively, if the SMT component is in contact with the PCB, but has a beveled edge, a smaller retainment detent that can engage the area between the beveled edge and the PCB can be provided. The two sides 44 also include contact/retainment detents 50 for making electrical contact between clip 40 and the terminals of the SMT component.

One advantage of this embodiment is that clip 40 can be electrically removed from the circuit without physically removing the clip. For example, a technician could gently flex one of the ends 44 away from the SMT component and insert a small insulator, such as a small plastic rod, between the end 44 and the terminal of the SMT component. Accordingly, this embodiment could prove useful during the debug phase of product development.

Figure 6:
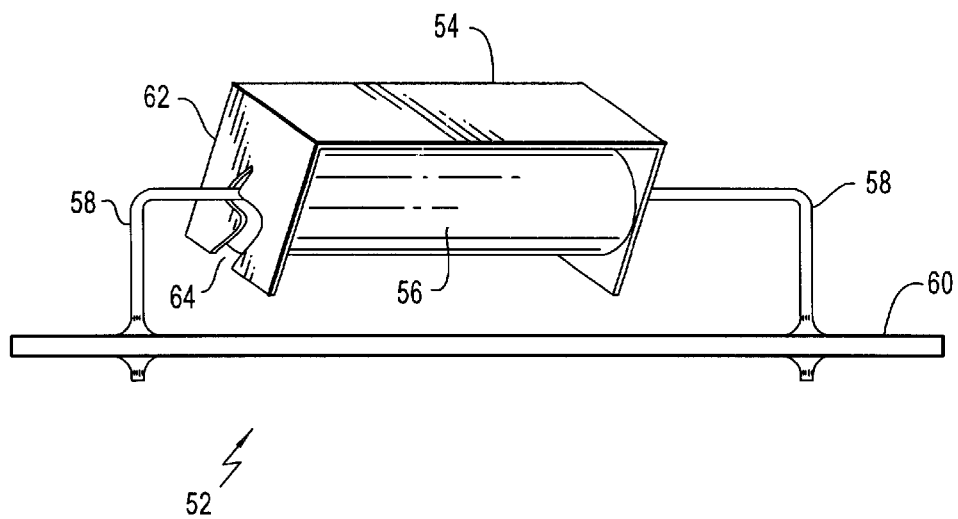
FIG. 6 shows yet another embodiment of the present invention wherein a clip is adapted for use with through hole mounted components having axial leads.

FIG. 6 shows yet another embodiment of the present invention for use with through hole mounted components having axial leads. In FIG. 6, assembly 52 includes conductive clip 54 placed over component 56, which may be, for example, a resistor. Component 56 includes a pair of axial leads that are soldered to PCB 60. Each end of clip 54 includes a slot. For example, end 62 includes slot 64. When clip 54 is placed over component 56, leads 58 are inserted into the slots, thereby making an electrical connection between clip 54 and the leads 58. One advantage of this embodiment is that the components can be provided by the vendor with the clips pre-installed, thereby reducing assembly costs even further.

Figure 7:
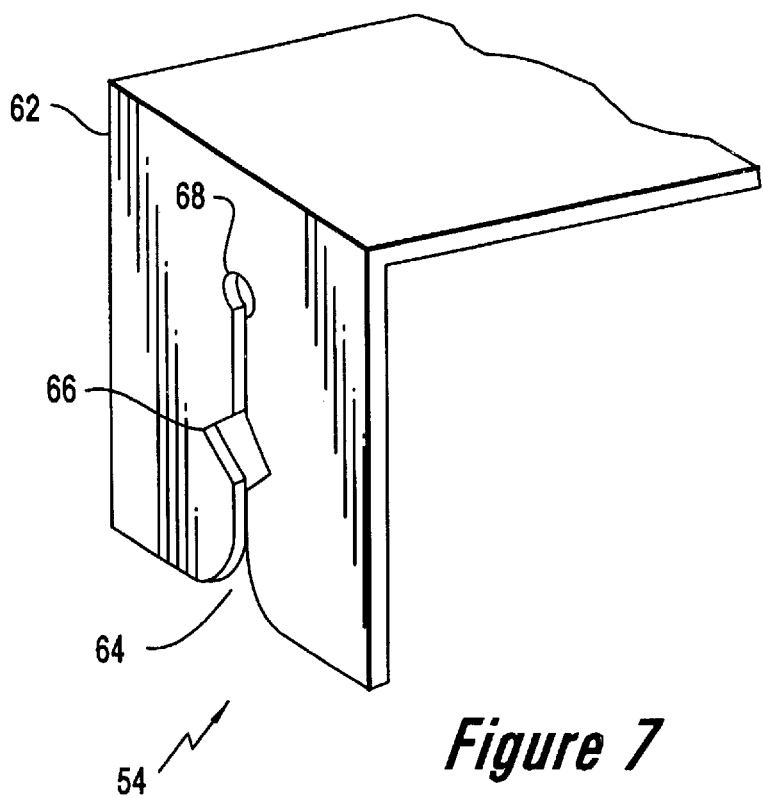
FIG. 7 shows an end of the clip of FIG. 6 in greater detail.

FIG. 7 shows end 62 of clip 54 in greater detail. Slot 64 includes a diamond shaped cutout 66 to receive the lead. The diamond shape of cutout 66 ensures a good electrical contact between clip 54 and the lead. Slot 64 also includes a strain relief hole 68 to relieve strain as slot 64 flexes to receive the lead into cutout 66.

Figure 8:
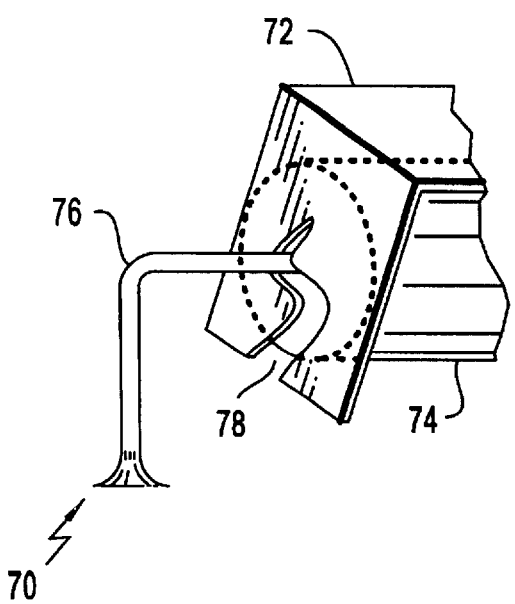
FIG. 8 shows an assembly similar to the assembly of FIG. 6, except that a different slot configuration is provided to receive the lead of the component.

FIG. 8 shows an assembly 70 similar to the assembly of FIGS. 6 and 7, except that a different slot configuration is provided. In FIG. 7, assembly 70 includes conductive clip 72 placed over component 74. Component 74 includes a pair of axial leads (with lead 76 shown in FIG. 8) that are soldered to a PCB. Slot 78 has a zig-zag pattern that narrows as the lead is inserted into the slot, thereby making electrical contact between lead 78 and clip 72. The zig-zig pattern also helps retain the clip in place.

As discussed above, the present invention allows a PCB to be designed to support multiple configurations without using DIP switches or headers/jumpers. The present invention does not require any additional space on a PCB, and does not require any additional PCB traces, thereby reducing PCB cost. In addition to reducing the cost of a PCB, the conductive clips themselves are much less expensive than either DIP switches or headers/jumpers, thereby reducing costs even further. Finally the present invention can be used to alter circuits in ways that were not anticipated when the PCB was designed.

Although the present invention has been described with reference to preferred embodiments, workers skilled in the art will recognize that changes may be made in form and detail without departing from the spirit and scope of the invention.

What is claimed is:

1. A conductive clip configured to be placed over a component to create an electrical short between first and second terminals of the component comprising:
    a member having a length approximately equal to the length of the component, the member comprising:
        a first end coupled to the member, for making electrical contact with the first terminal;
        a second end coupled to the member, for making electrical contact with the second terminal; and
        a cylindrical portion to provide an elastic force that urges the first and second ends toward the first and second terminals to retain the conductive clip to the component, and provide a leverage point that allows the conductive clip to be removed from the component.

2. A conductive clip configured to be placed over a component to create an electrical short between first and second terminals of the component comprising:
    a member having a length approximately equal to the length of the component;
    a first end coupled to the member, the first end including a first triangular retainment detent for making electrical contact with the first terminal and retaining the conductive clip to the component; and
    a second end coupled to the member, the second end including a second triangular retainment detent for making electrical contact with the second terminal and retaining the conductive clip to the component.

3. A conductive clip configured to be placed over an SMT component to create an electrical short between first and second terminals of the component, wherein solder fillets are used to couple the first and second terminals to a printed circuit board, the conductive clip comprising:
    a member having a length approximately equal to the length of the component;
    a first end coupled to the member, for making electrical contact with the first terminal;
    a second end coupled to the member, for making electrical contact with the second terminal; and
    a retainment feature for retaining the conductive clip to the component, wherein the first and second ends each include a flared portion that electrically engages a solder fillet and allows the end to slide over the solder fillet as the conductive clip is pressed onto the SMT component.

4. A conductive clip configured to be placed over a through hole mounted component to create an electrical short between first and second axial leads of the component, the conductive clip comprising:
    a member having a length approximately equal to the length of the component;
    a first end coupled to the member, for making electrical contact with the first axial lead;
    a second end coupled to the member, for making electrical contact with the second axial lead; and
    a retainment feature for retaining the conductive clip to the component, wherein each of the first and second ends has a slot to receive an axial lead.

5. The conductive clip of claim 4, wherein the retainment feature comprises a diamond shaped cutout in the slot, and the slot includes a strain relieving hole at an end of the slot.

6. The conductive clip of claim 4 wherein the retainment feature is provided by a narrowing zig-zag pattern of the slot.

7. An assembly comprising:
    a printed circuit board;
    a component having first and second terminals soldered to the printed circuit board; and
    a conductive clip placed over the component to create an electrical short between the first and second terminals, the conductive clip comprising:
        a member having a length approximately equal to the length of the component and a cylindrical portion;
        a first end coupled to the member, for making electrical contact with the first terminal;
        a second end coupled to the member, for making electrical contact with the second terminal; and
        a retainment feature for retaining the conductive clip to the component, wherein the cylindrical portion provides an elastic force that urges the first and second ends toward the first and second terminals, and provides a leverage point that allows the conductive clip to be removed from the component.

8. An assembly comprising:
    a printed circuit board;
    a component having first and second terminals soldered to the printed circuit board; and
    a conductive clip placed over the component to create an electrical short between the first and second terminals, the conductive clip comprising:

a member having a length approximately equal to the length of the component;

a first end coupled to the member, for making electrical contact with the first terminal;

a second end coupled to the member, for making electrical contact with the second terminal; and a retainment feature for retaining the conductive clip to the component, wherein the retainment feature comprises a first triangular retainment detent punched into the first end, and a second triangular retainment detent punched into the second end.

9. An assembly comprising:

a printed circuit board;

an SMT component having first and second terminals soldered to the printed circuit board via solder fillets; and a conductive clip placed over the component to create an electrical short between the first and second terminals, the conductive clip comprising:

a member having a length approximately equal to the length of the component;

a first end coupled to the member, for making electrical contact with the first terminal;

a second end coupled to the member, for making electrical contact with the second terminal; and a retainment feature for retaining the conductive clip to the component, wherein the first and second ends each include a flared portion that electrically engages a solder fillet and allows the end to slide over the solder fillet as the conductive clip is pressed onto the SMT component.

10. An assembly comprising:

a printed circuit board;

a through hole mounted component having first and second axial leads soldered to the printed circuit board; and a conductive clip placed over the component to create an electrical short between the first and second axial leads, the conductive clip comprising:

a member having a length approximately equal to the length of the component;

a first end coupled to the member, for making electrical contact with the first axial lead;

a second end coupled to the member, for making electrical contact with the second axial lead; and a retainment feature for retaining the conductive clip to the component, wherein each of the first and second ends has a slot to receive an axial lead.

11. The assembly of claim 10 wherein the retainment feature comprises a diamond shaped cutout in the slot, and the slot includes a strain relieving hole at an end of the slot.

12. The assembly of claim 10 wherein the retainment feature is provided by a narrowing zig-zag pattern of the slot.

* * * * *